(12) United States Patent
Imamura et al.

(10) Patent No.: US 11,062,892 B2
(45) Date of Patent: Jul. 13, 2021

(54) CHARGED PARTICLE DETECTOR INCLUDING A LIGHT-EMITTING SECTION HAVING LAMINATION STRUCTURE, CHARGED PARTICLE BEAM DEVICE, AND MASS SPECTROMETER

(71) Applicant: HITACHI HIGH-TECH CORPORATION, Tokyo (JP)

(72) Inventors: Shin Imamura, Tokyo (JP); Takashi Ohshima, Tokyo (JP); Tomonobu Tsuchiya, Tokyo (JP); Hajime Kawano, Tokyo (JP); Makoto Suzuki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/070,790

(22) PCT Filed: Jan. 25, 2017

(86) PCT No.: PCT/JP2017/002413
§ 371 (c)(1),
(2) Date: Jul. 18, 2018

(87) PCT Pub. No.: WO2017/130987
PCT Pub. Date: Aug. 3, 2017

(65) Prior Publication Data
US 2019/0027351 A1    Jan. 24, 2019

(30) Foreign Application Priority Data

Jan. 29, 2016  (JP) .............................. JP2016-015025

(51) Int. Cl.
*G01T 1/20* (2006.01)
*H01J 49/02* (2006.01)
(Continued)

(52) U.S. Cl.
CPC .............. *H01J 49/025* (2013.01); *G01T 1/20* (2013.01); *G01T 1/2018* (2013.01); *G01T 1/24* (2013.01);
(Continued)

(58) Field of Classification Search
None
See application file for complete search history.

(56) References Cited

U.S. PATENT DOCUMENTS 5,932,880 A * 8/1999 Koguchi ............... H01J 37/244
250/397
7,910,895 B2   3/2011 Uchiyama et al.
(Continued)

FOREIGN PATENT DOCUMENTS

JP    2005-298603 A    10/2005
JP    2009-080124 A    4/2009
(Continued)

OTHER PUBLICATIONS

International Search Report, PCT/JP2017/002413, dated May 23, 2017, 2 pgs.
(Continued)

*Primary Examiner* — James Choi
(74) *Attorney, Agent, or Firm* — Volpe Koenig

(57) ABSTRACT

The objective of the present invention is to provide a charged particle detector and a charged particle beam device with which it is possible to acquire a high luminous output while rapidly eliminating charged particles that are incident to a scintillator. In order to achieve said objective the present invention proposes: a charged particle detector provided with a light-emitting unit including a laminated structure obtained by laminating a GaInN-containing layer and a GaN layer, and provided with a conductive layer that is in contact with the GaInN-containing layer on the charged particle incidence surface side of the laminated structure; and a charged particle beam device.

10 Claims, 7 Drawing Sheets

(51) Int. Cl.
*H01J 37/244* (2006.01)
*G01T 1/24* (2006.01)

(52) U.S. Cl.
CPC ..... *H01J 37/244* (2013.01); *H01J 2237/2443* (2013.01); *H01J 2237/28* (2013.01)

(56) References Cited

U.S. PATENT DOCUMENTS

| | | |
|---|---|---|
| 2004/0061054 A1 | 4/2004 | Kondo et al. |
| 2004/0069950 A1* | 4/2004 | Ando .................. G01T 1/1644 250/361 R |
| 2011/0316028 A1* | 12/2011 | Strassburg ............. H01L 33/40 257/98 |
| 2018/0059268 A1* | 3/2018 | Hospodkov .......... G01T 1/1644 |

FOREIGN PATENT DOCUMENTS

| | | | |
|---|---|---|---|
| JP | 2014-032029 A | | 2/2014 |
| JP | 2014032029 A | * | 2/2014 |

OTHER PUBLICATIONS

German Office Action dated Apr. 27, 2021 for German Patent Application No. 112017000260.5.

Balakrishnan, "Time-resolved photo and radio-luminescence studies demonstrate the possibility of using InGaN/GaN quantum wells as fast scintillators," Nanotechnology 26 (2015).

Buckley et al., "High Quantum Efficiency AIGaN/InGaN Photodetectors," No. Final Report. Washington Univ., St. Louis MO (United States), (2009).

* cited by examiner (a)

(b)

CHARGED PARTICLE DETECTOR INCLUDING A LIGHT-EMITTING SECTION HAVING LAMINATION STRUCTURE, CHARGED PARTICLE BEAM DEVICE, AND MASS SPECTROMETER

TECHNICAL FIELD

The present invention relates to a charged particle detector and a charged particle beam device, and particularly relates to a charged particle detector provided with a quantum well structure and a charged particle beam device provided with the charged particle detector.

BACKGROUND ART

A charged particle beam device that detects charged particles obtained by irradiating a sample with a charged particle beam such as an electron beam is provided with a detector that detects the charged particles. In a case of detecting, for example, electrons emitted from the sample by scanning an electron beam across the sample, the electrons are guided to a scintillator in an electron detector by applying a positive voltage of approximately 10 kV to the detector. Light generated by the scintillator due to bombardment of electrons is guided to a light guide, converted into an electrical signal by a light-receiving element such as a phototube to be used as an image signal or a waveform signal.

Patent Document 1 discloses a scintillator having a luminous body including an InGaN/GaN quantum well layer formed on a substrate. Furthermore, Patent Document 1 describes providing a cap layer higher in band gap energy than a constituent material of a nitride semiconductor layer that includes the InGaN/GaN quantum well layer on the InGaN/GaN quantum well layer, and further providing a metal backing layer configured with Al on the cap layer.

Patent Document 2 describes providing a cap layer obtained by growing a GaN layer on a multilayer structure in which GaInN and GaN are alternately laminated and further evaporating an Al thin film on the cap layer for prevention of static charge during electron injection.

PRIOR ART DOCUMENT

Patent Document

Patent Document 1: JP-2005-298603-A (corresponding U.S. Pat. No. 7,910,895)
Patent Document 2: JP-2014-32029-A

SUMMARY OF THE INVENTION

Problem to be Solved by the Invention

The electrons incident on the scintillator are negatively charged. If such electrons remain in the scintillator, the electron repel electrons incident later, resulting in a reduction in a quantity of incident electrons. Furthermore, it takes a little time for some residual electrons to emit light after incidence on the scintillator, which causes a reduction in an emission speed. As described in Patent Documents 1 and 2, it has been made clear from considerations by inventors that the cap layer formed on the quantum well layer causes the residual electrons to remain in the quantum well layer.

A charged particle detector and a charged particle beam device with an object to promptly eliminate charged particles incident on a scintillator while achieving high emission output are proposed hereinafter.

Means for Solving the Problem

As one aspect for achieving the object, a charged particle detector including a light-emitting section having a lamination structure in which a GaInN-containing layer and a GaN layer are laminated, the charged particle detector including a conductive layer that is in contact with the GaInN-containing layer and that is provided on a charged particle incident face side of the lamination structure is proposed below.

Effect of the Invention

According to the present invention, it is possible to promptly eliminate charged particles incident on a scintillator while achieving high emission output.

MODES FOR CARRYING OUT THE INVENTION

A charged particle beam device provided with a detector that has a scintillator as a detection element will be described hereinafter with reference to the drawings and the like. An example of an electron microscope, particularly a scanning electron microscope will be described hereinafter; however, an embodiment to be described hereinafter is not limited to the example but also applicable to other charged particle beam devices such as a scanning ion microscope using an ion beam. Furthermore, the embodiment is applicable to a measuring device, an inspection device, an observation device, and the like for a semiconductor pattern using a scanning electron microscope.

It is assumed that a scintillator mentioned in the present specification refers to a device on which a charged particle beam is incident and which emits light. The scintillator in the present embodiment can take on various shapes and structures without being limited to those described in the embodiment.

Figure 1:
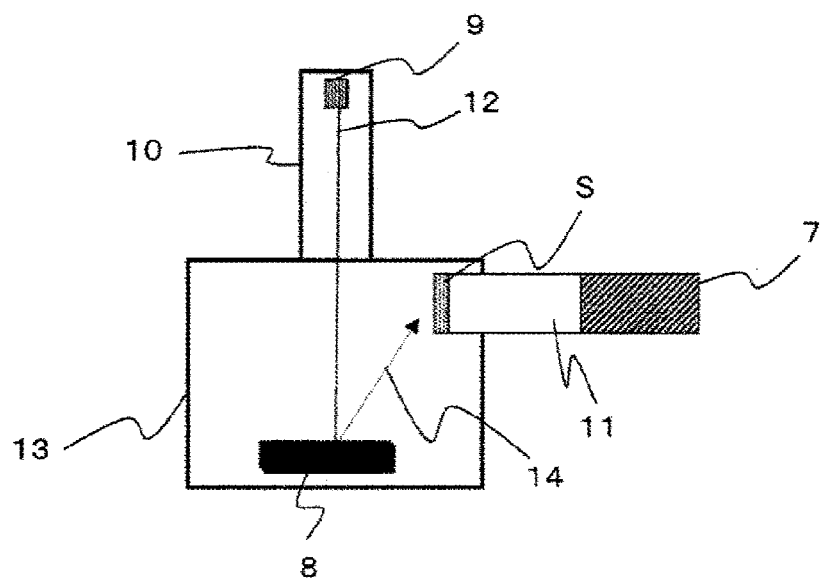
FIG. 1 is a diagram illustrating a basic configuration of an electron microscope.

FIG. 1 is a diagraph illustrating a basic configuration of an electron microscope. A sample 8 is irradiated with a primary electron beam 12 emitted from an electron source 9 and secondary particles 14 such as secondary electrons or reflected electrons are emitted. The secondary particles 14 are attracted to be incident on a scintillator S. When the secondary particles 14 are incident on the scintillator S, the scintillator S emits light. The light emitted by the scintillator S is guided by a light guide 11 and converted into an electrical signal by a light-receiving element 7. A combination of the scintillator S, the light guide 11, and the light-receiving element 7 will be often referred herein to as "detection system."

The signal obtained by the light-receiving element 7 is converted into an image to be associated with an electron beam irradiation position, and the image is displayed. An electron-optical system, that is, a deflector, a lens, an aperture, an objective lens, and the like for focusing the primary electron beam 12 onto the sample and irradiating the sample with the primary electron beam 12 are not depicted in the drawing. The electron-optical system is installed in an electron-optical lens barrel 10. Furthermore, the sample 8 is turned into a movable state by being placed on a sample stage, and the sample 8 and the sample stage are disposed in a sample chamber 13. Normally, the sample chamber 6 is kept in a vacuum state during electron beam irradiation. Moreover, although not depicted, a control section that controls actions of entire and individual components, a display section that displays images, an input section to which a user inputs action instructions for the electron microscope, and the like are connected to the electron microscope.

This configuration of the electron microscope is an example and another configuration is also applicable as long as the electron microscope includes the scintillator, the light guide, and the light-receiving element. Furthermore, the secondary particles 14 include transmitted electrons, scanned and transmitted electrons, and the like. Moreover, for the sake of brevity, only one detector is depicted; alternatively, a detector for reflected electron detection and a detector for secondary electron detection may be provided separately or a plurality of detectors may be provided for detecting electrons upon discriminating azimuth angles or elevation angles.

Figure 2:
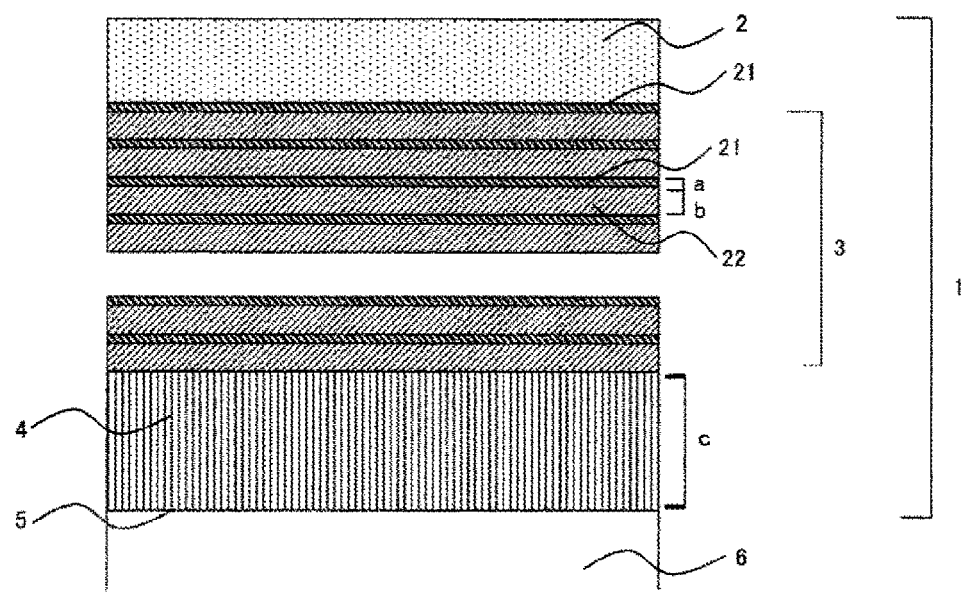
FIG. 2 is a diagram illustrating a configuration of a scintillator.

A specific configuration of the scintillator will be described below. FIG. 2 is a schematic diagram illustrating the scintillator S of a first embodiment. As a material of a scintillator light-emitting section 1, a light-emitting element having a quantum well structure containing GaN is used.

As a structure of the scintillator light-emitting section 1 and a method of manufacturing the scintillator light-emitting section 1 in the first embodiment, a GaN buffer layer 4 was grown on a sapphire substrate 6, and a plurality of layers containing $Ga_{1-x-y}Al_xIn_yN$ (where 0≤x≤1, 0≤y≤1) were grown on the GaN buffer layer 4 with a component thereof changed, thereby forming a quantum well structure 3. An Al layer 2 (conductive layer) was directly formed on the quantum well structure 3. This Al layer 2 is formed on a side on which charged particles to be detected are incident within a charged particle beam device.

Figure 3:
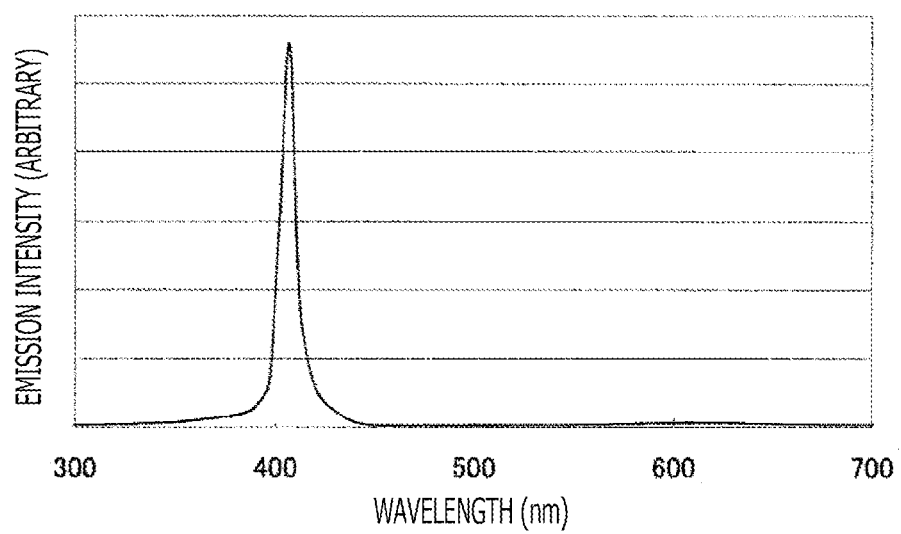
FIG. 3 is a chart illustrating an emission spectrum of the scintillator.

The sapphire substrate 2 has a disc shape at a 2-inch φ, and the buffer layer was grown to have a thickness "c" in a range from 3 to 10 μm. The quantum well structure 3 is configured such that quantum well layers 21 having a component of $Ga_{1-y}In_yN$ and barrier layers 22 having a component of GaN are alternately laminated in a range of 2 to 30 cycles, and a thickness of the quantum well structure 3 is in a range of 20 to 1000 nm. The Al layer 2 was formed to have a thickness in a range of 40 to 200 nm on this structure by evaporation to serve to prevent static charge during electron injection. A piece at a predetermined size sliced from this light-emitting section 1 was used as the scintillator. FIG. 3 illustrates an example of an emission spectrum of the scintillator described above.

The quantum well layers or the barrier layers are not necessarily identical in thickness and component. Furthermore, an interface 5 between the light-emitting section 1 and the sapphire substrate 6 may be either flat or have an irregular structure. For example, forming a structure in which protruding structures at a structure pitch of 10 to 1000 nm and a structure height of 10 to 10000 nm are continuously formed is effective for improving emission output by extracting the emitted light.

In the configuration of the present embodiment, the quantum well layer 21 is present at a position just under the Al layer. The layer in contact with the Al layer is the quantum well layer 21 that has a component of $Ga_{1-y}In_yN$ (where 0≤y≤1) and that is lower than GaN in band gap energy. This layer, which contains In, is higher in electric conductivity than the GaN layer; furthermore, electrons easily flow into this layer since the layer has a narrow band gap. Owing to this, the electrons incident on the quantum well structure 3 can immediately move to the Al layer. The Al layer is formed with a conductor, so that the electrons are eliminated without remaining in the scintillator light-emitting section 1.

If the electrons incident on the quantum well structure 3 are not immediately eliminated, then the residual electrons, which are negatively charged, act as a repulsive force against electrons incident later, reduce a quantity of incident electrons, and cause a reduction in emission output. Moreover, the residual electrons often cause delayed emission that means that it takes a little time for the residual electrons to emit light after incidence, which causes detriment to high-speed characteristics of emission.

According to the above configuration, it is possible to increase the emission output and accelerate the emission by promptly eliminating incident electrons.

Figure 4:
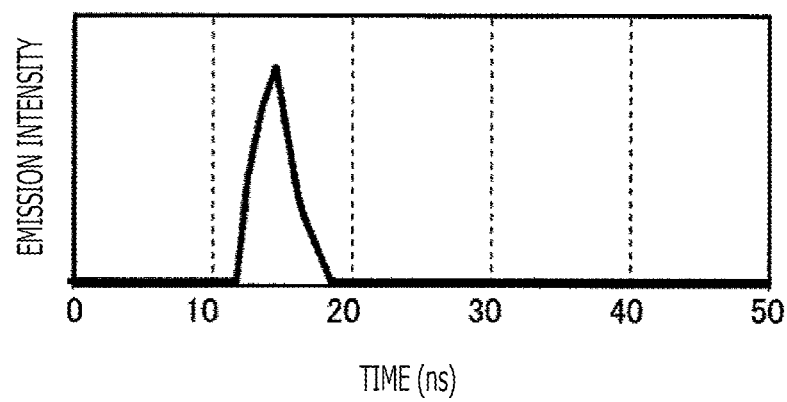
FIGS. 4(a) and 4(b) are charts illustrating changes in an emission intensity relative to a change in a quantum well layer over time.
Figure 4:
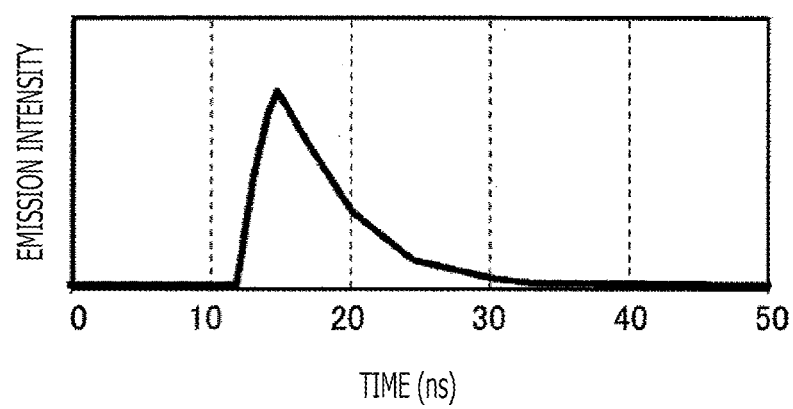

FIG. 4 illustrates results of evaluating changes in the emission output after incidence at quite a high speed in nanoseconds. FIG. 4(a) is a chart illustrating a change in the emission intensity relative to a time change in a case in which the Al layer is in direct contact with the GaInNa layer. On the other hand, FIG. 4(b) is a chart illustrating a change in the emission intensity in a case of forming the Al layer on the layer such as the GaN layer having a wide band gap. It is clear from FIG. 4(b) that the emission remains over several tens nanoseconds after rising of the emission intensity. This is because the residual electrons cause delayed emission of several tens nanoseconds as depicted in FIG. 4(b). Such emission impairs the high-speed characteristics and deteriorates characteristics of the device. On the other hand, it is clear from FIG. 4(a) that the emission disappears within 10 ns after rising of the emission intensity. This is because, in part, the residual electrons are eliminated immediately.

Figure 5:
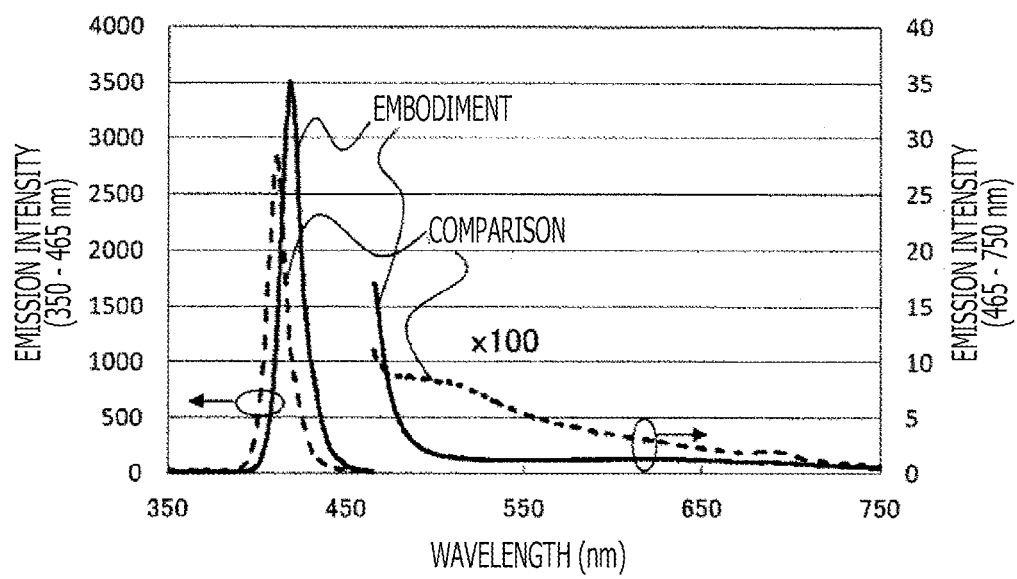
FIG. 5 is a chart illustrating an emission spectrum per structure of the scintillator.

FIG. 5 is a chart illustrating an emission spectrum of the scintillator configured such that the Al layer is in direct contact with the GaInN layer (in the embodiment) and an emission spectrum of a scintillator configured such that an Al layer is formed on a GaN layer (in a comparison). In the comparison, a thickness of the GaN buffer layer 4 grown on the sapphire substrate 6 is equal to or smaller than 2.5 μm.

Principal emission peaks at a wavelength between 350 nm and 450 nm. Attention is now paid to the emission at wavelengths equal to or larger than 460 nm. FIG. 5 illustrates the emission spectrums with the emission enlarged by 100 times in the range equal to or larger than 460 nm. In the comparison, the emission is observed in a range from 460 to 700 nm. In the embodiment, the emission is hardly observed in this range.

It is considered that if an electron beam is accelerated at, for example, 10 kV, the electron beam penetrates the materials of the present embodiment at a depth of up to approximately 1 μm. At this time, the electron beam breaks through the thickness of the quantum well structure 3 and penetrates the buffer layer 4. In this case, if many impurities and/or crystal defects are contained in GaN of the buffer layer, the emission is generated by the electron beam. In the comparison, the buffer layer is thin; thus, it is considered that many impurities and/or defects are contained in GaN crystals at the depth of arrival of the electron beam and that the emission is generated in the range from 460 to 700 nm.

In the embodiment, the thickness of the buffer layer was set to be equal to or larger than 3 μm and a growth temperature of the buffer layer was set to equal to or higher than 1000° C. By so setting, the buffer layer at the depth at which the electron beam penetrates the buffer layer exhibits preferable crystallinity and contains fewer impurities and/defects. As a result, the emission is hardly observed in the range from 460 to 700 nm.

Figure 6:
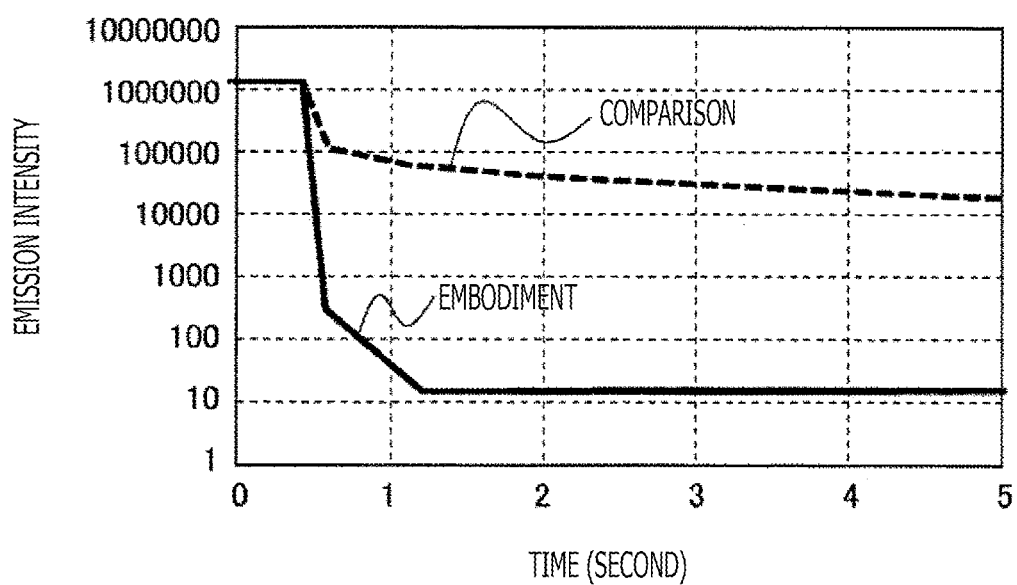
FIG. 6 is a chart illustrating a change in an emission intensity of the scintillator over time.

The emission in this range from 460 to 700 nm does not result from recombination of the quantum well layers, so that response time of the emission is long. Owing to this, the emission in this range has longer attenuation time. FIG. 6 illustrates a change in the emission in seconds. In FIG. 6, states of attenuation of the emission after the electron beam injection are compared. In the comparison, the emission attenuates to approximately only 1/100 after five seconds. In the embodiment, the emission attenuates to approximately 1/100000 after two seconds.

If emission attenuation time is long, an electron incidence interval cannot be set short and high-speed measurement cannot be made. In the embodiment, the attenuation time is sufficiently short, so that high-speed measurement can be made.

In this way, it was shown that response characteristics of the light in the present embodiment greatly sped up, compared with the comparison. A charged particle beam detector capable of high-speed scanning and ensuring high performance by the configuration with the detector having this scintillator was obtained.

Preferably, the scintillator illustrated in FIG. 2 is produced in the following conditions. To discover more suitable conditions, scintillators were manufactured while changing a ratio b/a of the thickness "b" of the barrier layer 22 to the thickness "a" of the quantum well layer 21. Manufacturing ranges are such that the ratio b/a is in a range from 1.5 to 10 and the thickness "a" of the quantum well layer 21 is in a range from 2 to 4 nm.

Normally, a quantum effect increases when the thickness of the quantum well layer 21 is equal to or smaller than 4 nm, so that it is possible to expect shift of the emission wavelength to small wavelengths and an increase in emission efficiency. At this time, however, the small thickness of the barrier layer 22 often causes a deterioration in the crystallinity and a reduction in the emission intensity. Furthermore, the excessively small thickness of the quantum well structure 3 relative to an electron beam penetration distance often causes insufficient use of the electron beam and the reduction in the emission intensity. A range of the highest emission intensity was newly discovered under the influence of these effects.

Figure 7:
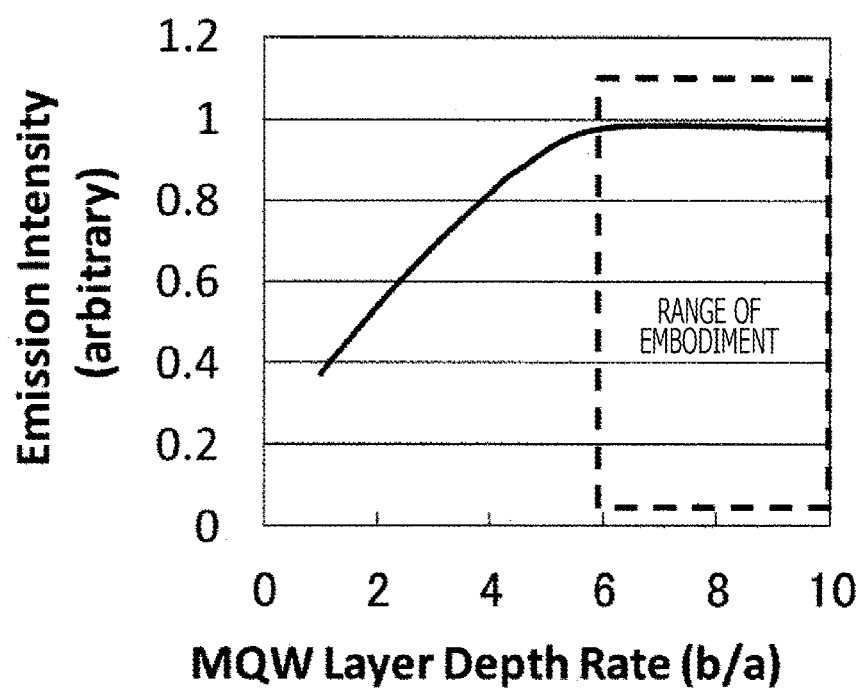
FIG. 7 is a chart illustrating a relationship between a ratio of the quantum well layer to a barrier layer and the emission intensity.

FIG. 7 is a chart illustrating a relationship between the ratio b/a and the emission intensity. It was found from FIG. 7 that the emission intensity increased until the ratio b/a of approximately 5, and the emission intensity reached almost the maximum at the ratio b/a equal to or higher than 6. In other words, setting the ratio b/a equal to or higher than 6 can realize the scintillator that can achieve both the high emission intensity and the high-speed response.

The scintillator that realizes both the high emission intensity and the high-speed response can handle high-speed scanning, so that it is possible to provide a charged particle beam device also capable of acquiring a sufficient S/N by the high-speed scanning.

Figure 9:
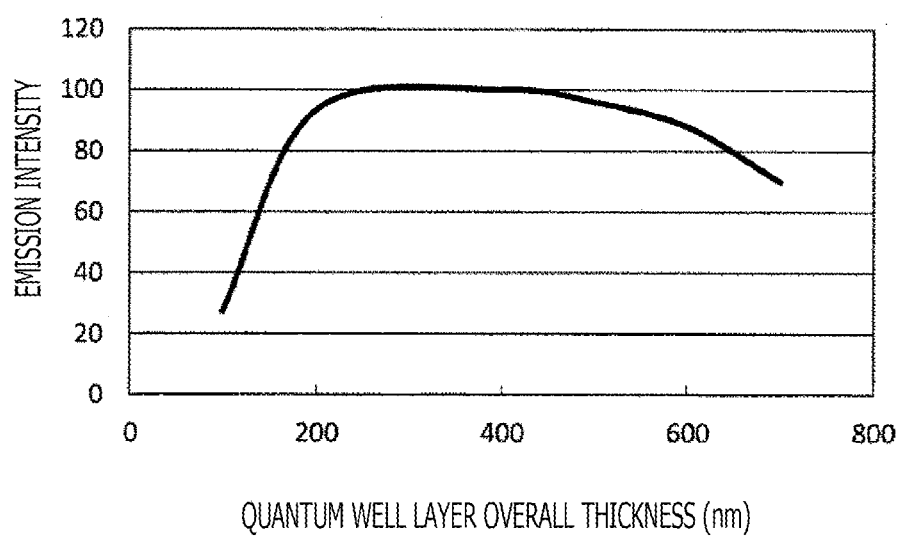
FIG. 9 is a graph illustrating a relationship between a thickness of a quantum well structure 3 and the emission intensity.

Moreover, a new effect was discovered in terms of a relationship between the number of the quantum well layers 21 and an overall thickness of the quantum well structure 3. FIG. 9 illustrates a change in the emission intensity relative to the overall thickness of the quantum well structure 3 in the present embodiment. FIG. 9 is an example of irradiating the sample with the electron beam accelerated at 10 kV as the charged particle beam. It is understood that the emission intensity reaches the maximum if the overall thickness of the quantum well structure 3 is 200 to 600 nm. Moreover, according to this relationship between the number of layers and the emission intensity, if the electron beam accelerated at 10 kV is used, the characteristics are almost similar even with a change in the number of quantum well layers 22 from five to twenty-five.

This indicates that even if the number of quantum well layers 22 changes to some extent, an effect produced by the overall thickness of the quantum well structure 3 has a greater influence on the emission intensity. Moreover, it was found that the relationship between the overall thickness of the quantum well structure 3 and the emission intensity varies depending on the accelerating voltage applied to the charged particle beam to be radiated. The distance by which the charged particle beam penetrates the substances irradiated with the charged particle beam varies depending on the accelerating voltage. As described above, the penetration distance of the electron beam accelerated at 10 kV is approximately 1 μm in the present embodiment. It is clear from this respect that an important factor for the emission intensity is that the electron beam at up to what depth causes the emission, and that the depth of the quantum well structure 3 in which the emission is generated may be approximately one-fifth to three-fifths of the penetration distance of the electron beam.

Furthermore, the smaller number of quantum well layers 22 is advantageous for the emission characteristics since the disorder of constituent crystals is less and crystal defects that cause unnecessary emission decreases. Owing to this, it is indicated that if the depth of the quantum well structure 3 is kept equal to or larger than a half of the penetration distance of the charged particle beam, the number of quantum well layers 22 has a degree of freedom to some extent but reducing the number of quantum well layers 22 particularly in a certain range can contribute to improving the emission characteristics. It was found by considerations in the present embodiment that the range of the number of quantum well layers 22 was 5 to 25.

Figure 8:
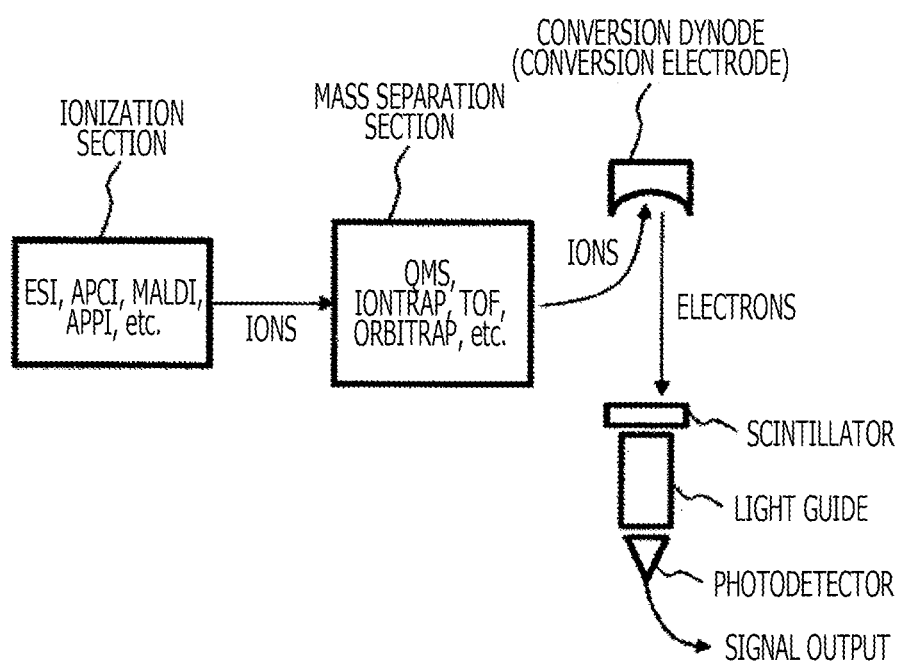
FIG. 8 is a diagram illustrating a configuration of a mass spectrometer.

While an example of applying the scintillator to the detector in the scanning electron microscope or the like has been mainly described above, the scintillator described above may be adopted as a detector in a mass spectrometer. FIG. 8 is an explanatory diagram of a configuration of a mass spectrograph. The mass spectrometer subjects ions to mass separation by an electromagnetic action and measures mass-to-charge ratios of the ions to be measured. Types of a mass separation section include a QMS type, an ion trap type, a time-of-flight (TOF) type, an FT-ICR type, an Orbitrap type, a compound type of those types, and the like. In the mass spectrometer illustrated in FIG. 8, mass-selected ions by the mass separation section are caused to bombard a conversion electrode referred to as "conversion dynode" to convert the ions into charged particles, the generated charged particles are detected by the scintillator, and then the emitted light is detected, thereby obtaining signal output. Applying the abovementioned scintillator to the scintillator in the mass spectrometer illustrated in FIG. 8 makes it possible to provide the mass spectrometer capable of high-speed, high-sensitivity analysis.

DESCRIPTION OF REFERENCE CHARACTERS

1: Scintillator light-emitting section
2: Al layer
3: Quantum well structure
4: Buffer layer
5: Light-emitting section-substrate interface
6: Substrate
7: Light-receiving element
8: Sample
9: Electron source
10: Electron-optical lens barrel
11: Light guide
12: Primary electron beam
13: Sample chamber
14: Secondary electron beam
21: Quantum well layer
22: Barrier layer

The invention claimed is:

1. A charged particle detector including a light-emitting section having a lamination structure in which a GaInN-containing layer and a GaN layer are laminated, the charged particle detector comprising:
an electrically conductive layer that is in direct contact with the GaInN-containing layer and that is provided on a charged particle incident face side of the lamination structure, wherein a composition of the GaInN-containing layer is $Ga_{1-y} In_y N(0<y<1)$,
wherein a relationship between a thickness "a" of the GaInN-containing layer and a thickness "b" of the GaN layer is $10 \geq b/a \geq 6$.

2. The charged particle detector according to claim 1, wherein
the light-emitting section has a thickness ranging from one-fifth to three-fifths of a penetration distance of a charged particle beam.

3. The charged particle detector according to claim 1, wherein
a number of a plurality of the GaInN-containing layers is in a range from 5 to 25.

4. The charged particle detector according to claim 1, wherein
the light-emitting section is formed on a substrate, and protruding structures formed continuously and having a pitch of 10 to 2000 nm and a height of 10 to 20000 nm are formed either between the substrate and the light-emitting section or on the substrate.

5. A charged particle beam device including a detector that detects charged particles obtained on the basis of irradiation with a charged particle beam emitted from a charged particle source, wherein
the detector includes a light-emitting section having a lamination structure in which a GaInN-containing layer and a GaN layer are laminated, and includes an electrically conductive layer that is in direct contact with the GaInN-containing layer and that is provided on a charged particle incident face side of the lamination structure, wherein a composition of the GaInN-containing layer is $Ga_{1-y} In_y N(0<y<1)$, and a relationship between a thickness "a" of the GaInN-containing layer and a thickness "b" of the GaN layer is $10 \geq b/a \geq 6$.

6. A mass spectrometer including a detector that detects ions subjected to mass separation, wherein comprising:
a mass spectrometer including a detector that detects ions subjected to mass separation,
wherein the detector includes a light-emitting section having a lamination structure in which a GaInN-containing layer and a GaN layer are laminated, and includes an electrically conductive layer that is in direct contact with the GaInN-containing layer and that is provided on a charged particle incident face side of the lamination structure, wherein a composition of the GaInN-containing layer is $Ga_{1-y} In_y N(0<y<1)$), and a relationship between a thickness "a" of the GaInN-containing layer and a thickness "b" of the GaN layer is $10 \geq b/a \geq 6$.

7. The charged particle detector according to claim 1, wherein a thickness "a" of the GaInN-containing layer is 2-4 nm.

8. The charged particle detector according to claim 1, wherein the lamination structure forms a quantum well structure in which a GaInN-containing layer and a GaN layer are laminated.

9. The charged particle beam device according to claim 5, wherein the lamination structure forms a quantum well structure in which a GaInN-containing layer and a GaN layer are laminated.

10. The A mass spectrometer according to claim 6, wherein the lamination structure forms a quantum well structure in which a GaInN-containing layer and a GaN layer are laminated.

* * * * *